United States Patent [19]

Boduch et al.

[11] 4,291,118

[45] Sep. 22, 1981

[54] RELIEF IMAGING LIQUIDS

[75] Inventors: Paul Boduch, Arlington; Robert Trasavage, Mashpee, both of Mass.

[73] Assignee: W. R. Grace & Co., Cambridge, Mass.

[21] Appl. No.: 106,816

[22] Filed: Dec. 26, 1979

[51] Int. Cl.$^3$ .............................................. G03C 5/00
[52] U.S. Cl. ................................... 430/313; 430/281; 430/286; 430/323; 430/325; 430/327; 430/494
[58] Field of Search ............... 430/286, 313, 323, 325, 430/327, 494, 281

[56] References Cited

U.S. PATENT DOCUMENTS

| | | | |
|---|---|---|---|
| 3,144,331 | 8/1964 | Thommes | 430/327 |
| 3,520,606 | 7/1970 | Gush et al. | 355/85 |
| 3,600,243 | 8/1971 | La Rocque et al. | 430/327 X |
| 3,661,660 | 5/1972 | Wessells et al. | 156/345 X |
| 3,661,744 | 5/1972 | Kehr et al. | 204/159.14 |
| 3,859,091 | 1/1975 | Wessells et al. | 430/327 X |
| 3,936,301 | 2/1976 | Schneider | 430/327 X |
| 4,145,790 | 3/1979 | Wessells et al. | 15/306 R |

OTHER PUBLICATIONS

"Introduction to Photofabrication using Kodak Photosensitive Resists", pp. 18, 19, 22, 28, 29, 1966.

*Primary Examiner*—Mary F. Downey
*Attorney, Agent, or Firm*—Edward J. Hanson, Jr.; C. Edward Parker

[57] ABSTRACT

A method of relief imaging liquids, particularly in manufacturing circuit boards, by providing a film of liquid photopolymer, solidifying the liquid by chemical hardening using actinic light, then pattern exposing the solidified film to actinic light to differentially chemically condition the film and then removing the portions of the film not exposed to the patterened exposure of actinic light. Also the product produced by the method.

14 Claims, No Drawings

RELIEF IMAGING LIQUIDS

The present invention relates to forming relief images from liquid masses, particularly liquid films.

SUMMARY OF THE INVENTION

By an aspect of the invention a method is provided for relief imaging a liquid. The method comprises forming the liquid into a liquid mass, preferably in the form of a planar liquid film. Then the liquid film is exposed to a chemical hardening treatment sufficient to solidify the film. Thereafter the film is further treated in a pattern in a manner differentiating the chemical condition of the solidified mass of the film in the pattern as distinct from the chemical condition of the solidified mass not in the pattern. Afterwards the portion of the mass in one of the chemical conditions is selectively removed leaving that portion of the mass in the other chemical condition to form a relief image.

The liquid is preferably comprised of a photopolymer composition containing an actinic light active photo initiator. The chemical hardening treatment is preferably by exposing at least substantially the entire mass of the film to actinic light and solidification is to at least a substantially non-tacky surface on the film that is not easily mared. The preferred further treatment in a pattern includes positioning a photo tool in direct, at least substantially completely covering, contact with the non-tacky surface and exposing the film to further actinic light through the photo tool to produce the pattern provided by the tool. Then the portion of the mass not exposed to the further actinic light is selectively removed leaving the portion exposed to the further actinic light.

Other features of the invention involve using the preferred film thickness of between 0.1 and 5 mils maintaining the time between the first chemical hardening treatment and the further treating to less than 30 minutes, forming the planar film by depositing the liquid photopolymer on the circuit board in a limited coverage and spreading the photopolymer with an air knife and practicing the method as a continuous procedure from forming the liquid into the liquid mass to the selective removal of the solidified mass.

A further feature of the invention is the product produced by the procedure. This is, of course, in its preferred form an intermediate circuit board product suitable for further processing into a finished electronics component.

PREFERRED EMBODIMENT

While the invention can have many uses, its present preferred aspect is in the manufacture of circuit boards.

By the present invention a blank circuit board is coated with a liquid polymer, the polymer is solidified by chemical hardening, the solidified polymer is then treated in a desired pattern to chemically differentiate the solidified polymer in the pattern and a portion of the solidified polymer is removed leaving the desired pattern in its desired negative or positive form.

The blank circuit board is usually a stiff board member of phenolic or some other material clad with an electrically conducting coating such as copper. The "blank" circuit board can actually already have holes drilled in it and be otherwise complex but as will be apparent hereinafter is blank insofar as the subsequently described patterning is concerned.

The liquid coating or film is preferably a photopolymer. Examples of suitable polymeric systems are revealed in U.S. Pat. No. 3,661,744 the contents of which are incorporated herein by reference. The photopolymers as will be noted are polymeric compositions containing photoinitiators which are activated by actinic light.

The liquid film or mass may be applied in any convenient manner such as by curtain coating, wave coating, roller coating, spray coating, dip coating and doctor blade coating. Preferably an air knife is used to spread the coating. A suitable air knife is shown in U.S. Pat. No. 4,145,790. The method involves placing a stream of photopolymer along one edge of the circuit board and then spreading the photopolymer as a thin film using the air knife. The film is preferably applied or spread out to an applied thickness of between 0.1 and 5 mils more preferably 0.5 to about 3 mils.

The polymer is then solidified by chemical hardening. By chemical hardening it is meant by internal chemical change within the polymer as distinct from hardening by removal of a liquid solvent leaving a solid residue behind. By solidified it is meant a solid as contrast with a very viscous liquid which has been produced in the past by very brief pre-exposures that were followed by secondary exposure to solidify the exposed pattern portion. While the mass will normally be substantially solid all the way through, so long as it is solid at the surface in the sense of substantial firmness this is all that is required.

The solidification serves at least two important functions, first it enables a negative or positive photographic film (photo tool) to be placed directly on the polymer's surface which eliminates the previously required spacing member or air gap which allowed a loss of fidelity in the reproduced pattern. Secondly it allows the blank circuit board—solidified polymer composite or laminate to be handled, even picked up by hand with the fingers on the polymer, turned upside down, stored in an envelope and moved without being mared or otherwise damaged. To prevent maring and sticking of the patterened film to the solidified mass it should be chemically hardened in a way having no, or at least substantially no, surface tackiness or stickiness.

The chemical hardening treatment is preferably by radiation with actinic light. This usually involves exposing the entire mass to actinic light, or substantially the entire mass, by which it is meant all of the mass except for some edges or the like outside of the area that is to be used. As extensions of the invention however any form of radiation can be used, such as for example, high energy ionizing radiation, and the formulation could then be varied to even non-photopolymer in proper circumstances. Heat could also by extension be used and other polymeric compositions used. One can even easily extend the invention to non-polymeric systems. When actinic light is used the source can be of the stationary or scanning type.

After the liquid has been solidified, a photo tool such as a negative or positive photofilm or any other patterned member allowing the passage of the intended chemical hardening differentiating force may be laid directly on the solidified masses surface. By an extension of the invention, in some instances the force itself could be applied in a predetermined pattern and no photo tool would be used.

When a photo tool is used it should be considered part of the further treatment of the polymeric mass in a pattern that provides a patterned chemical condition in the solidified mass differentiated from the chemical condition of the solidified mass not in the pattern. This is preferably done using the photo tool and projecting radiation, particularly the preferred actinic radiation, through clear areas in the film and blocking the radiation with opaque areas in the film in known manner. For example, see the patents listed herein. Other means of patterning the solidified mass, by extension, would be with a laser moved in a predetermined pattern directed by computer.

The preferred further treatment and particularly the further radiation is preferably begun in less than 30 minutes, more preferably 10 minutes, from the first or initial chemical hardening treatment. Even though the solidified mass may be handled and stored, in many chemical photopolymer systems the initial curing is to such an extent that a retention time between treatments of 30 minutes or longer would result in the inability to attain a proper differentiation chemical condition in the solified mass. Furthermore the process is preferably carried out as a continuous process.

The selective removal of the portion of the mass in one chemical condition leaving that portion of the mass in the other chemical condition to form the relief image may be done in any convenient manner. A preferred manner is to wash out the portion to be removed. Preferably this is done in a manner supplying mechanical fluid scrubing action, at least some solvent action and in the case of aqueous systems some wetting action. Agitation or brushing in known manners used with dry resist may be used to aid the solvent. The pattern curing could in a properly constructed system cause a deterioration or in some other manner change the mass where the further patterned exposure occured enabling this portion to be the portion removed. However, generally the second or further patterned curing will further cure the further treated or exposed pattern and the portion not receiving the further exposure will be washed out or otherwise removed. This development of the relief image is generally followed with a final rinse to remove the developer. A final post exposure treatment may also be used to further harden the relief imaged mass when desired.

The method is preferably a continuous process. By this it is meant that from the time the photopolymer is applied to the time of development or etching there is no interruption in the sequential processing of the mass being relief imaged. This does not mean that the mass, or in the preferred form the coated circuit board, is not moved from station to station by hand, sometimes with minimal periods of delay as are normal in such manually assisted continuous processes.

The relief image can also be applied to both sides of the blank circuit board at the same time by for example, dip coating the circuit board with a photopolymer, positioning the board in a vertical position for the chemical hardening treatment that solidifies the liquid mass, placing a photo tool on both sides of the coated board and exposing both sides to actinic light through the photo tool and washing out the photopolymer not subject to this latter patterned exposure.

The product produced by the above described method is also a feature of the invention.

EXAMPLE

A blank copper clad circuit board was prepared for use in forming an electronic component in the following manner. The board was cleaned using Scotch BRITE PADS ® and water until the surface wet out with water showing the surface was clean. The board was then dried with hot air.

The board was then placed in an air knife machine as shown in U.S. Pat. No. 4,145,790. A puddle of liquid photopolymer of the type taught by U.S. Pat. No. 3,661,744 and available from W. R. Grace & Co. was spread across the leading edge of the board and passed under the air knife. The air knife spread the liquid photopolymer over the board leaving a film approximately 1 mil thick. The air knife was set at a speed of 0.74 inches/sec., height of 100 mils, gap of 40 mils and pressure of 3 psi.

The coated board was then removed to a photo imaging machine as shown in U.S. Pat. No. 3,520,606 and exposed to a chemical hardening treatment. This conditioning treatment consisted of exposing the photopolymer film to a light source 8 kw stationary pulse Xenon source 64 inches away for a 4 second exposure. This solidified the photopolymer and provided a substantially tack free and mar resistant surface.

Next a photo tool, a glass based photographic negative was placed in direct contact with the exposed face of the polymer. No air gap was present between the photo tool and the surface of the solidified photopolymer. The machine as shown in U.S. Pat. No. 3,520,606 was again used but with the Xenon source 39 inches away and an exposure of 4 minutes.

Next the image area was developed in an aqueous solution using equipment as illustrated in U.S. Pat. No. 3,661,660. The solution was 0.7% by weight NaOH in water. An emulsifier, igepal was used. The operating temperature was 150° F. and the sonic treatment was for 15 seconds. After removal from the bath the board was washed with water and it was determined that a good clean development of the photopolymer was obtained to the copper and the polymer in the patterned exposed areas remained in tack in excellent condition.

The teachings of U.S. Pat. Nos. 4,145,790; 3,520,606 and 3,661,660 are incorporated herein by reference.

It will be obvious to those skilled in the art that various changes and modifications may be made in the invention without departing from its true spirit and scope. It is, therefore, aimed in the appended claims to cover all such equivalent variations as fall within the true spirit and scope of the invention. For example by extension of the invention all instances where relief images are desired offer opportunities for the use of the present invention.

It is claimed:

1. A method of relief imaging a liquid polymeric composition comprising forming said liquid polymeric composition into a liquid mass, exposing said liquid mass to a first polymerizing actinic radiation chemical hardening treatment sufficient to solidify said liquid mass, thereafter further treating said solidified mass with polymerizing actinic radiation in a pattern and differentiating the chemical condition of said solidified mass in said pattern from the chemical condition of said solidified mass not in said pattern and thereafter selectively removing the portion of said solidified mass subjected to only said first polymerizing actinic radiation leaving that portion of said solidified mass subjected to said further polymerizing actinic radiation as a relief image.

2. The method of claim 1 wherein said liquid polymeric composition is comprised of a photopolymer composition containing an actinic light active photo initiator, said liquid mass is a planar film, said first polymerizing actinic radiation chemical hardening treatment is by exposing at least substantially the entire said liquid mass to actinic light and said solidification includes producing at least a substantially non-tacky surface on said solidified mass, said further treatment with polymerizing actinic radiation in a pattern comprising positioning a photo tool in direct at least substantially completely covering contact with said non-tacky surface and exposing said solidified mass to further actinic light through said photo tool producing said pattern as provided by said tool.

3. The method of claim 2 wherein said liquid polymeric composition is applied to a copper clad circuit board to form said liquid mass and said pattern extends entirely through said mass from said surface to the opposite face of said planar film which exposes said copper cladding on said circuit board.

4. The method of claim 3 wherein said planar film is between about 0.1 and about 5 mils thick and said method is a continuous procedure from forming said liquid polymeric composition into a liquid mass to said selective removal.

5. The method of claim 4 wherein said planar film is about 0.5 to about 3 mils thick and the time between said first polymerizing actinic radiation chemical hardening treatment and said further polymerizing actinic radiation treating is less than about 30 minutes.

6. The method of claim 1 wherein said solidification includes producing a surface that is not marred by direct physical contact by handling such as gripping it lightly with the human hand, and said further treatment with polymerizing radiation in a pattern further chemically hardens the said solidified mass in said pattern.

7. The method of claim 6 wherein said further polymerizing actinic radiation begins less than about 10 minutes after the completion of said first polymerizing actinic radiation.

8. The method of claim 6 wherein said first polymerizing actinic radiation is for a period of less than about 30 seconds and said further polymerizing actinic radiation is for a period of at least about 1 minute.

9. The method of claim 5 wherein said planar film is formed by depositing a liquid photopolymer on said circuit board in a limited coverage and spreading the photopolymer with an air knife.

10. A relief image formed by the process of forming a liquid polymeric composition into a liquid mass, exposing said liquid mass to a first polymerizing actinic radiation chemical hardening treatment sufficient to solidify said liquid mass, thereafter further treating said solidified mass with polymerizing actinic radiation in a pattern and differentiating the chemical condition of said solidified mass in said pattern from the chemical condition of said solidified mass not in said pattern and hereafter selectively removing the portion of said solidified mass subjected to only said first polymerizing actinic radiation leaving that portion of said solidified mass subjected to said further polymerizing actinic radiation as a relief image.

11. A relief image as claimed in claim 10 wherein the method includes using a liquid polymer composition comprised of a photopolymer composition containing an actinic light active photo initiator, said liquid mass is a planar film and wherein said first polymerizing actinic radiation chemical hardening treatment was by exposing at least substantially the entire said liquid mass to actinic light and said solidification included producing at least a substantially non-tacky surface on said solidified mass, and said further treatment with polymerizing actinic radiation in a pattern comprised positioning a photo tool in direct at least substantially completely covering contact with said non-tacky surface and exposing said solidified mass to further actinic light through said photo tool producing the pattern provided by said tool.

12. A relief image as claimed in claim 11 wherein said liquid polymeric composition was applied to a copper clad circuit board and said pattern extended entirely through said solidified mass from said substantially non-tacky surface to the opposite face of said planar film which exposed said copper cladding on said circuit board.

13. A relief image as claimed in claim 14 wherein said relief image is between about 0.1 and about 5 mils thick.

14. A relief image as claimed in claim 13 wherein said relief image is about 0.5 to about 3 mils thick and has a surface that is not marred by direct physical contact by handling such as gripping it lightly with the human hand.

* * * * *